(12) United States Patent
Chakraborty et al.

(10) Patent No.: US 8,786,347 B1
(45) Date of Patent: Jul. 22, 2014

(54) DELAY CIRCUITS FOR SIMULATING DELAYS BASED ON A SINGLE CYCLE OF A CLOCK SIGNAL

(71) Applicant: Texas Instruments Incorporated, Dallas, TX (US)

(72) Inventors: Abhishek Chakraborty, Bangalore (IN); Nagalinga Swamy Basayya Aremallapur, Haveri (IN); Vikas Narang, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/893,703

(22) Filed: May 14, 2013

(51) Int. Cl.
 *H03H 11/26* (2006.01)
 *H03K 5/13* (2014.01)

(52) U.S. Cl.
 CPC .................................. *H03K 5/132* (2013.01)
 USPC ........... 327/265; 327/261; 327/262; 327/263; 327/264; 331/17; 331/57

(58) Field of Classification Search
 CPC ........ H03L 7/0995; H03L 7/18; H04N 1/405; G06F 21/554; H03K 5/1252

USPC ............ 327/261, 262, 263, 264, 265; 331/17, 331/57
 See application file for complete search history.

(56) References Cited

U.S. PATENT DOCUMENTS 7,764,132 B2 * 7/2010 Jacobowitz et al. ............ 331/57

\* cited by examiner

*Primary Examiner* — John Poos
(74) *Attorney, Agent, or Firm* — Mirna Abyad; Frederick J. Telecky, Jr.

(57) ABSTRACT

In an embodiment, a delay circuit includes a ring oscillator circuit and a counter circuit. The ring oscillator circuit includes a delay chain having delay elements and configured to generate one of more clock cycles of an oscillator clock signal in response to a clock cycle of a clock signal. The counter circuit includes two counters that are configured to store a count state corresponding to a number of clock cycles of the oscillator clock signal during a single clock cycle of the clock signal. A first buffer is configured to store the number of clock cycles of the oscillator clock signal. The delay circuit includes a buffer to store a bit pattern corresponding to a number of delay elements traversed in a partial clock cycle of the oscillator clock signal in response to the clock cycle of the clock signal based on outputs of the plurality of delay elements.

20 Claims, 5 Drawing Sheets

DELAY CIRCUITS FOR SIMULATING DELAYS BASED ON A SINGLE CYCLE OF A CLOCK SIGNAL

TECHNICAL FIELD

The present disclosure generally relates to delay circuits.

BACKGROUND

In accordance with an example scenario, a delay line is capable of providing a fixed delay (e.g., a programmable delay) independent of voltage, temperature and/or process variations. The delay line utilizes a reference (e.g., a reference clock) to calibrate and ensure the fixed delay. Some delay lines include one or more delay elements connected or coupled with one another in series. Some delay lines can be configured to provide a fixed delay of either $\frac{1}{4}^{th}$ or $\frac{1}{5}^{th}$ of a reference clock period by modeling the clock period in four or five delay elements, respectively. However, in applications such as de-skewing in circuits, fixed delays that are different than $\frac{1}{4}^{th}$ or $\frac{1}{5}^{th}$ of the reference clock period are required to be implemented. Also, in the delay lines configured to provide the fixed delay, a frequency range is limited by a length of the delay lines and a response time to process, temperature, and voltage variations is limited.

SUMMARY

A number of example delay circuits and methods for generating a plurality of delay codes through the delay circuits are disclosed herein. In an embodiment, a delay circuit includes a ring oscillator circuit and a counter circuit. The ring oscillator circuit includes a delay chain including a plurality of delay elements. An inverted output of the delay chain is coupled with an input of the delay chain. The ring oscillator circuit is configured to generate one or more cycles of an oscillator clock signal in response to a clock cycle of a clock signal. The counter circuit is communicatively associated or coupled with the ring oscillator circuit. The counter circuit includes a first counter configured to be triggered at a rising edge of the oscillator clock signal at an output of a delay element of the plurality of delay elements, and a second counter is configured to be triggered at a falling edge of the oscillator clock signal at the output of the delay element. A first buffer is configured to store a number of clock cycles of the oscillator clock signal in response to the clock cycle of the clock signal based on a count state of one of the first counter and the second counter. A second buffer is configured to store a bit pattern corresponding to a number of delay elements traversed in a partial clock cycle of the oscillator clock signal in response to the clock cycle of the clock signal based on outputs of the plurality of delay elements. The number of clock cycles stored in the first buffer and the bit pattern corresponding to the number of delay elements in the partial clock cycle correspond to a delay code for the clock signal, where the delay code corresponds to a number of delay elements and wherein a sum of delays generated by the number of delay elements is substantially equal to a clock period of the clock signal.

Additionally, in an embodiment, a method is disclosed that includes generating one or more clock cycles of oscillator clock signal in a cycle of a clock signal, by a delay chain including a plurality of delay elements where an inverted output of the delay chain is coupled with an input of the delay chain. The method further includes storing a count state corresponding to a number of complete clock cycles of the one or more clock cycles using a count state of one of a first counter and a second counter, wherein the first counter is configured to be triggered at a rising edge of the oscillator clock signal at an output of a delay element of the plurality of delay elements, and wherein the second counter is configured to be triggered at a falling edge of the oscillator clock signal at the output of the delay element. The method further includes storing a bit pattern corresponding to a number of delay elements traversed in a partial clock cycle of the oscillator clock signal in response to the single clock cycle of the input clock signal, based on outputs of the plurality of delay elements. The number of complete clock cycles and the bit pattern corresponding to the number of delay elements in the partial cycle correspond to a delay code for the clock signal, wherein the delay code corresponds to a number of delay elements and wherein a sum of delays generated by the number of delay elements is substantially equal to a clock period of the clock signal.

DETAILED DESCRIPTION

Various embodiments of the present technology provide circuits for simulating various delays corresponding to a single cycle of a clock signal, or for simulating delays corresponding to predetermined delays. For example, various embodiments are capable of generating delay codes, where the delay codes represent a number of delay elements used to generate the required delays. Such delay circuits act as delay compensation blocks and the delay codes generated by these delay circuits are used by a circuit module (such as an I/O device) for generating any desired delays for compensation. For instance, the circuit module may be able to generate delays according to the delay codes for achieving a desired Process Temperature Voltage (PTV) compensated slew rate, skew matching, clock recovery, duty cycle correction, etc. The following description and accompanying figures demonstrate that the present technology may be practiced or otherwise implemented in a variety of different embodiments. It should be noted, however, that the scope of the present technology is not limited to any or all of the embodiments disclosed herein. Indeed, one or more of the devices, features, operations, processes, characteristics, or other qualities of a disclosed embodiment may be removed, replaced, supplemented, or changed.

Figure 1:
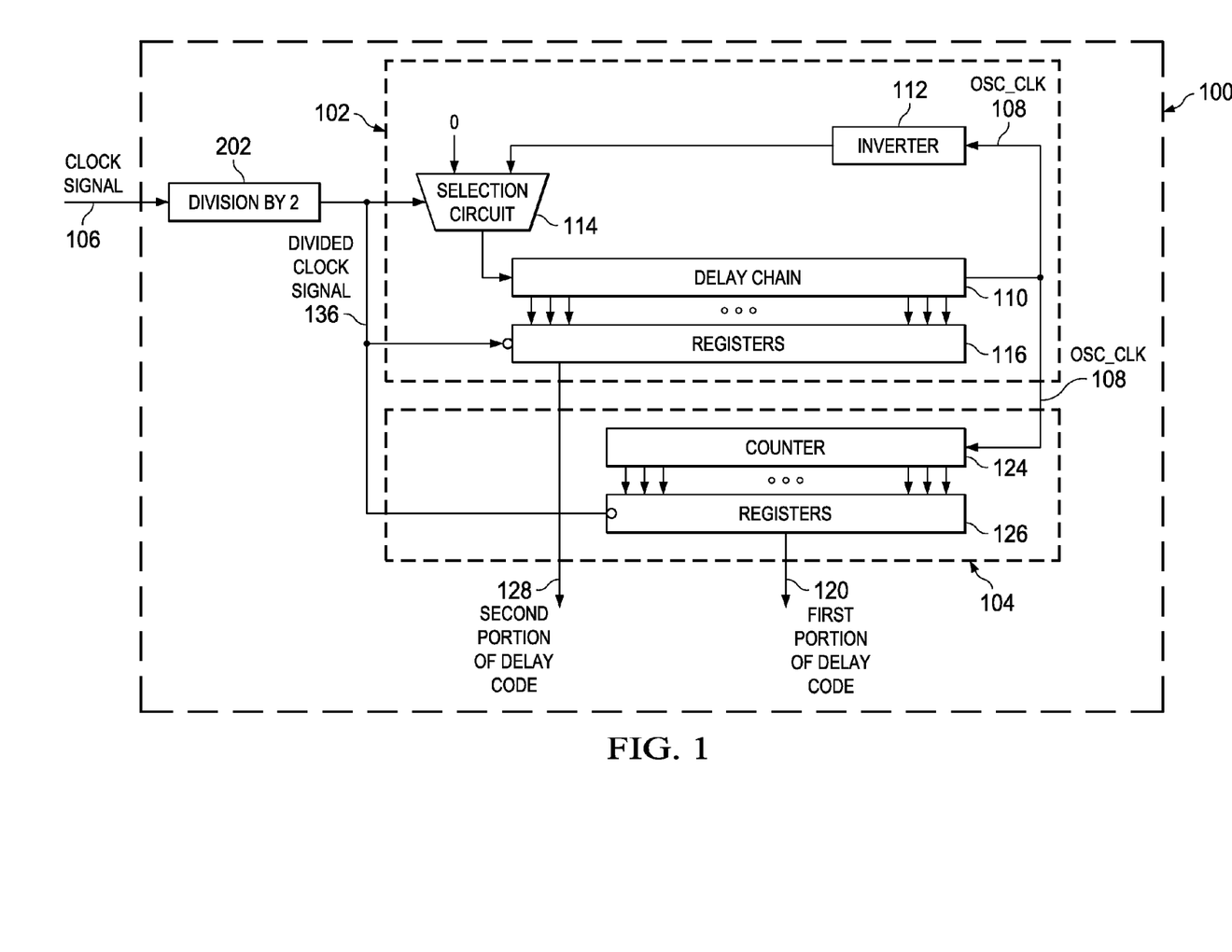
FIG. 1 is a delay circuit for generating a delay code, according to an example scenario.

FIG. 1 is a delay circuit 100 for generating a delay code, according to an example scenario. In an example, the delay code corresponds to a number of delay elements that are required to generate a particular time delay. For example, the delay code corresponds to a single clock cycle of an input clock signal, or the delay code corresponds to a predetermined time period. The delay circuit 100, as shown in FIG. 1, is configured to receive a clock signal to generate a delay code corresponding to a single clock cycle of the clock signal. The delay code corresponds to a number of delay elements such that the total delay generated by these delay elements is equal to a time period of the single clock cycle. In an example, the delay circuit 100 includes a ring oscillator circuit 102 and a counter circuit 104. The ring oscillator circuit 102 is communicatively associated or coupled with the counter circuit 104. In an example, the ring oscillator circuit 102 is configured to receive a clock signal 106 and generate an oscillator clock signal 108 (shown as 'osc_clk 108'). The osc_clk 108 clocks the counter circuit 104. The ring oscillator circuit 102 includes a delay chain 110 having a plurality of delay elements connected or coupled in series and an inverter 112, where the inverter 112 receives the output of the delay chain 110 and an output of the inverter 112 is coupled with an input of delay chain 110. Examples of the delay elements include, but are not limited to, buffers, flip flops, programmable logic devices, and logic gates.

The delay chain 110 is configured to receive the clock signal 106 and generate the osc_clk 108 based on passing a signal level corresponding to the clock signal 106 through the ring oscillator 102. For instance, the osc_clk 108 is generated based on traversing a signal level of the clock signal 106 through the delay chain 110 and the inverter 112. In an embodiment, the signal level is a single high pulse of a divided clock signal 136. In an example, the divided clock signal 136 is the clock signal 106 that is divided by two to overcome duty cycle issues. The ring oscillator 102 generates the one or more clock cycles of the osc_clk 108 in a single cycle of the clock signal 106. For example, during a high level of the divided clock signal 136, one or more cycles of the osc_clk 108 is generated. For instance, the high signal level corresponding to the clock signal 106 is traversed through the delay chain 110 in one or more traversals (in a closed loop), as a duration of the high signal level is equal to total delays generated by delay elements in the one or more traversals. In an example, the one or more traversals is at least one of one or more complete traversals and a partial traversal, and the duration of the signal level of the divided clock signal 136 is equal (or substantially equal) to a sum of delays generated by each delay element in the one or more complete traversals and the partial traversal of the delay chain 110.

In an embodiment, the delay circuit 100 further includes a selection circuit 114 and a set of registers 116. The selection circuit 114 is communicatively associated or coupled with the inverter 112. In an example, the selection circuit 114 is a 2:1 multiplexer where the divided clock signal 136 is coupled as a select line to the selection circuit 114. As the signal level of the divided clock signal 136 is high, the output of the delay chain 110 (the osc_clk 108) is fed to input of the delay chain 110. During the low level of the divided clock signal 136, a fixed logic signal (for example, zero) is tied to the input of the delay chain 110. Accordingly, the delay chain 110 of the ring oscillator circuit 102 is enabled at the rising edge of the divided clock signal 136 and is disabled at a falling edge of the divided clock signal 136.

The counter circuit 104 includes a counter 124 and a set of registers 126. The counter 124 is clocked by the osc_clk 108 from the ring oscillator circuit 102 and is configured to count a number of cycles (complete traversals) of the osc_clk 108 corresponding to the signal level of the clock signal 106. For instance, if there is any transition from 0 to 1 (i.e., a new clock cycle) of the osc_clk 108, the counter 124 is incremented. In an example, if a new clock cycle of the osc_clk 108 occurs (during the high level of the divided clock signal 136), count state of the counter 124 gets incremented by 1. The set of registers 126 are communicatively associated or coupled with the counter 124 and stores the number of cycles of the osc_clk 108. The number of cycles is also stored as a first portion 120 of the delay code. In an example, the second set of registers 126 is clocked by the divided clock signal 136.

The set of registers 116 is clocked by the divided clock signal 136. The set of registers 116 is communicatively associated or coupled with the delay elements of the delay chain 110 and is configured to store a number of delay elements (shown as a second portion 128) traversed in a partial clock cycle of the osc_clk 108. The second portion 128 corresponds to a number of delay elements traversed in the partial clock cycle. In an example, the partial clock cycle represents an incomplete clock cycle of the osc_clk 108 generated in addition to one or more complete clock cycles of the osc_clk 108 during the high signal level of the divided clock signal 136. It should be noted that a combination of the first portion 120 of the delay code and the second portion 128 of the delay code represents the number of delay elements required for generating a delay equal to a single clock cycle of the clock signal 106. Accordingly, a delay code corresponding to the clock signal 106 is generated based on the first portion 120 and the second portion 128. In an example, the first portion 120 forms the most significant bits (MSBs) of the delay code and the second portion 128 forms the least significant bits (LSBs) of the delay code.

In an example scenario, it may be assumed that a time period of the clock signal 106 is 420 pico seconds (ps). The clock signal 106 is divided by 'two' to generate the divided clock signal 136 of a time period of 840 ps. The divided clock signal 136 is fed as a select line to the selection circuit 114 that triggers the delay chain 110, during a high signal level of the divided clock signal 136. If in an example, the delay chain 110 includes ten delay elements, each generating a delay of 10 ps, a single clock cycle of the osc_clk 108 would generate a delay of 200 ps through the delay chain 110. The high signal level of the divided clock signal 136 (of a time duration of 420 ps) would correspond to two clock cycles of the osc_clk 108 generated by the delay chain 110 and a partial clock cycle amounting to a delay of remaining 20 ps (corresponding to a delay substantially equivalent to two delay elements of 10 ps delay each).

In an example, a count state of the counter 124 is updated based on each clock cycle of the osc_clk 108. In the above example, the counter 124 generates the first portion of the delay code (shown as) 120 corresponding to two clock cycles of the osc_clk 108. The set of registers 126 stores a binary equivalent of two as the second portion 128 of the delay code. The set of registers 116 stores the second portion 128 of the delay code corresponding to 20 ps (e.g. based on outputs of the two delay elements during the partial clock cycle of the osc_clk 108). The first portion 120 of the delay code constitutes the MSBs of the delay code and the second portion 128 constitutes the LSBs of the delay code. The delay code corresponding to the clock signal 106 (of 420 ps time period) is thereby generated based on the values stored in the set of registers 116 and the set of registers 126.

It should be noted that in some cases, metastability conditions may arise while determination of the delay codes corresponding to the clock signal 106. For example, if there are 128 delay elements present in the delay chain 110, and each delay element generates a delay of 1 ps, a total delay of 256 ps would be generated in a single clock cycle of the osc_clk 108. If the time period of the clock signal 106 is 1024 ps, four cycles of the osc_clk 108 will be generated. Due to a phenomenon, such as clock skew, the state of the counter 124 may show a state of 4, and at the same instance the set of registers 116 may also show a count of 127 or even 128, leading to a significant error in the determining of the delay codes.

Various example embodiments of the present technology provide solutions to overcome metastability issues while determining the delay codes, and these embodiments are described in reference to FIGS. 2 to 6.

Figure 2:
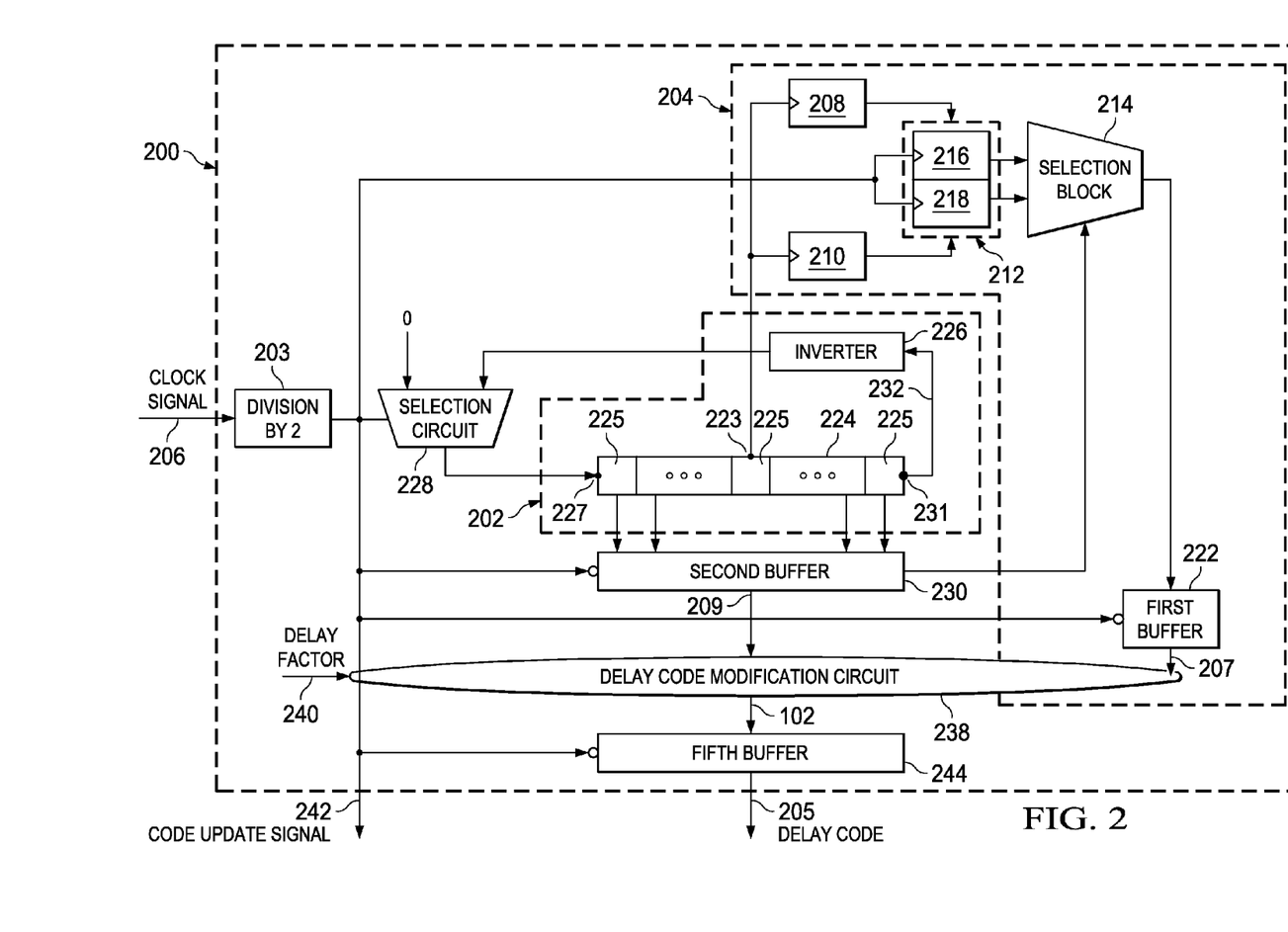
FIG. 2 is a delay circuit for generating a delay code, according to an example embodiment.

FIG. 2 is an example delay circuit 200 for generating a delay code, according to an example embodiment. The delay circuit 200 includes a ring oscillator circuit 202 and a counter circuit 204. The counter circuit 204 is communicatively associated or coupled with the ring oscillator circuit 202 such that the ring oscillator circuit 202 and the counter circuit 204 are configured to generate a delay code corresponding to a clock signal 206. The delay code corresponding to the clock signal 206 represents a number of delay elements such that a sum of total delays generated by the number of delay elements is same (or substantially same) as a time period of the clock signal 206. In an example, the delay code has a two part binary delay codes (a first portion 207 and a second portion 209) and is generated by the ring oscillator circuit 202 and the counter circuit 204. In an embodiment, the delay circuit 200 also includes a delay code modification circuit 238 coupled to the ring oscillator circuit 202 and the counter circuit 204. The delay code modification circuit 238 is configured to receive the delay code (a combination of the first portion 207 and the second portion 209) and to generate a modified delay code 205 based on performing mathematical operations on the delay code. The modified delay code 205 is provided to a circuit module (such as an I/O circuit) for generating a required delay in the circuit module for generating any compensation delay in various applications in the circuit module. The circuit module may be an external or internal circuit that is electronically or electrically associated with the delay circuit 200 to receive the modified delay code. For instance, the circuit module may be a module in the same Integrated Circuit (IC) that embodies the delay circuit 200, or alternatively may be a module present in a different IC.

The ring oscillator circuit 202 includes a delay chain 224 and an inverter 226. In an embodiment, the ring oscillator circuit 202 is configured to receive the clock signal 206 and generate an oscillator clock signal 232 (also referred to as 'osc_clk 232') at an output (shown as 231) of the delay chain 224 by passing a signal level corresponding to the clock signal 206 through the delay chain 224. In an embodiment, the signal level is a single high pulse of a divided clock signal of the clock signal 206. As shown in FIG. 2, the clock signal 206 is divided (by a clock divider circuit 203) by two to generate the divided clock signal. The delay chain 224 includes a plurality of delay elements (shown as 225). Examples of the delay elements 225 include, but are not limited to, buffers, flip flops, programmable logic devices, and logic gates. The inverter 226 is communicatively associated or coupled with the output 231 of the delay chain 224 and an output of the inverter 226 is coupled with an input 227 of the delay chain 224 via a selection circuit 228. The selection circuit 228 is an example of the selection circuit 114 as explained in reference to FIG. 1. The selection circuit 228 is configured to actuate the delay chain 224 at a rising edge of the divided clock signal and the delay chain 224 starts generating the osc_clk 232. For instance, during the time period when the divided clock signal is high, the inverted output of the delay chain 224 is fed to input (shown as 227) of the delay chain 224 in order to generate the osc_clk 232. It should be noted that in an alternate embodiment, the selection circuit 228 is also configured such that the osc_clk 232 is generated when the divided clock signal is at low level. The ring oscillator circuit 202 generates the one or more clock cycles of the osc_clk 232 in a single cycle of the clock signal 206. For example, during a high level of the divided clock signal (also shown as a code update signal 242), one or more cycles of the osc_clk 232 is generated. It should be noted that during the high pulse of the divided clock signal, one or more complete clock cycles and a partial clock cycle (if occurs) of the osc_clk 232 is generated, as a duration of the high level of the divided clock signal is equal to total delays generated by delay elements in the one or more complete clock cycles and the partial clock cycle of the osc_clk 232.

In an example, the counter circuit 204 along with the ring oscillator circuit 202 is configured to determine the first portion 207 of the delay code (e.g., MSBs of the delay code). In an example, the ring oscillator circuit 202 is configured to determine the second portion 209 of the delay code (e.g., LSBs of the delay code). In an example, the counter circuit 204 includes a first counter 208, a second counter 210, a register block 212, and a selection block 214. An example of the first counter 208 is a positive edge triggered counter, and an example of the second counter 210 is a negative edge triggered counter, or vice versa. The register block 212 is communicatively associated or coupled with the first counter 208 and the second counter 210. The selection block 214 is communicatively associated or coupled with the register block 212. The register block 212 includes a third buffer 216 and a fourth buffer 218. The third buffer 216 is coupled to the first counter 208 to store a count state of the first counter 208 and the fourth buffer 218 is coupled to the second counter 210 to store a count state of the second counter 210. The selection block 214 is configured to select a count state associated with one of the third buffer 216 and the fourth buffer 218 as the first portion 207 of the delay code. In an embodiment, the counter circuit 204 additionally includes a first buffer 222 communicatively associated or coupled with the selection block 214. The first buffer 222 includes a set of registers. The first buffer 222 is configured to receive the count state associated with one of the third buffer 216 and the fourth buffer 218 from the selection block 214 and store the received count state as the first portion 207 of the delay code.

In an embodiment, the first counter 208 is actuated at a rising edge of the osc_clk 232 in response to a transition at an output of a delay element (other than the last delay element of the delay chain 224) of the plurality of delay elements 225 of the delay chain 224. The second counter 210 is actuated at a falling edge of the osc_clk 232 at the output of the delay element. For instance, if the delay chain 224 includes 128 delay elements, the first counter 208 is actuated at the rising edge of the osc_clk 232 at an output (shown as 223) of $64^{th}$ delay element (shown as 225 having the output 223) and the second counter 210 is actuated by the falling edge of the osc_clk 232 at the output 223 of the delay element 225. It should be noted that in some alternate embodiments, output of a delay element other than the $64^{th}$ element can also be utilized to trigger the counters 208 and 210.

Each of the first counter 208 and the second counter 210 are configured to count a number of clock cycles of the osc_clk 232 during a single clock period of the clock signal 206 (or during a high pulse of the divided clock signal). The counted number of clock cycles corresponds to the first portion 207 of the delay code. In an embodiment, the selection block 214 is communicatively associated or coupled with the first buffer 222 and is configured to select the count state associated with one of the first counter 208 or the second counter 210 based on a logic state of a delay element (e.g., $128^{th}$ delay element in the example explained above) of the plurality of delay elements of the delay chain 224. In this example, if the logic state of the 128$^{th}$ delay element is 1, the selection block 214 selects the count state associated with the first counter 208; and if the logic state of the delay element is 0, the selection block 214 selects the count state associated with the second counter 210. The selected count state is stored in the first buffer 222.

The delay circuit 200 further includes a second buffer 230 that is communicatively associated or coupled with the delay elements of the delay chain 224. The second buffer 230 includes a set of registers clocked by the divided clock signal. The second buffer 230 is communicatively associated or coupled with the delay elements of the delay chain 224 and is configured to store a number of delay elements (shown as the second portion 209) traversed in the partial clock cycle of the osc_clk 232. The second buffer 230 stores the number of delay elements based on outputs of the delay elements of the delay chain 224. The second portion 209 corresponds to a number of delay elements traversed in the partial clock cycle. In an example, the partial clock cycle represents an incomplete clock cycle of the osc_clk 232 generated in addition to one or more complete clock cycles of the osc_clk 232 during the high level of the divided clock signal. It should be noted that a combination of the first portion 207 and the second portion 209 of delay code represents the number of delay elements required for generating a delay equal to time period of the clock signal 206. For instance, the delay code corresponding to the clock signal 206 represents a number of delay elements, of which the total delays are same (or substantially same) as the time period of the clock signal 206.

As the delay code including the first portion 207 and the second portion 209 correspond to the time period of the clock signal 206, various embodiments of the present technology are capable of generating delay codes for a required delay other than the time period of the clock signal 206. For example, the delay code modification circuit 238 performs one or more mathematical operations on the delay code (a combination of the first portion 207 and the second portion 209) corresponding to the clock signal 206 to generate the modified delay code 205 corresponding to the required delay. In an example, the delay code modification circuit 238 is configured to modify the delay code based on a delay factor 240 to generate the modified delay code 205 that is required for a delay compensation in the circuit module. For example, the delay circuit 200, as shown in FIG. 2, is configured to receive the input clock signal (such as the clock signal 206) and the delay factor (such as the delay factor 240), and generate the modified delay code 205, such that a delay generated based on the modified delay code 205 is used for a delay compensation for the PTV variations, in the circuit module. For example, a required number of delay elements in the circuit module (such as the I/O device) can be activated to generate the required delay corresponding to the delay code 205 for achieving the delay compensation. It should be noted that the delay compensation may be used in applications including, but not limited to, slew rate compensation, skew matching, clock recovery, duty cycle correction, serializer/de-serializer application, data eye centering, etc. The mathematical operations performed to generate the delay code 205 includes division (e.g., binary division), multiplication (e.g., binary multiplication) or other similar mathematical operations. Examples of the delay factor 240 include, but are not limited to, a division factor, and a multiplication factor. Examples of the delay code modification circuit 238 include, but are not limited to, an integer divider, an integer combinational divider, and a sequential divider. In an embodiment, the delay code modification circuit 238 is communicatively associated or coupled with a circuit module (e.g., an input/output (I/O) circuitry) to provide the delay code 205 to the circuit module for facilitating a delay programmability of the circuit module. In an embodiment, the delay circuit 200 also includes a fifth buffer 244 to store the modified delay code.

It should be noted that the clock signal 206 is divided (e.g., divided by 2) and the osc_clk 232 is generated during the high pulse of the divided clock signal, in order to overcome duty cycle issues. In alternate embodiments, the osc_clk 232 is generated during a single clock cycle of the clock signal 206, or even in half cycle of the clock signal 206. In an embodiment, the divided clock signal (e.g., clock signal/2) is fed into the circuit module as a code update signal 242. In an embodiment, the delay code 205 is generated at a falling edge of the code update signal 242 and the delay code 205 is captured by the circuit module at a rising edge of the code update signal 242. In an embodiment, at least one of the first buffer 222, the second buffer 230, the third buffer 216 and the fourth buffer 218 are clocked by the clock signal 206 or the code update signal 242 (i.e. the divided clock signal generated by dividing the clock signal 206). An example scenario of determining the first portion 207 of the delay code is explained further in FIG. 3.

Figure 3:
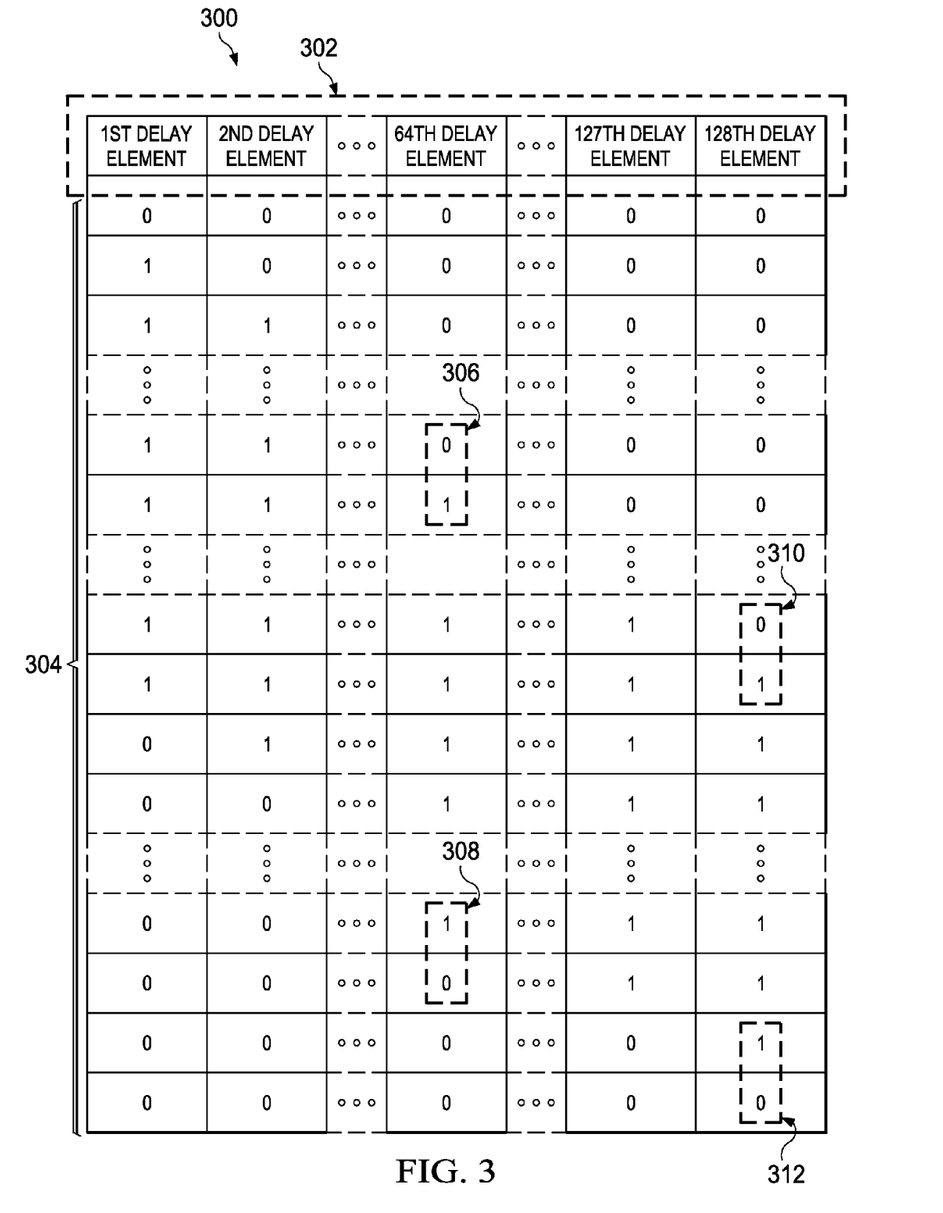
FIG. 3 is a tabular representation of various states of an example delay chain for generating a single clock cycle of an oscillator clock signal, according to an example embodiment.

FIG. 3 is a tabular representation 300 of various states of an example delay chain such as the delay chain 224 during generation of a cycle of the oscillation clock signal (the osc_clk 232), according to an example embodiment. The delay chain 224 includes 128 number of delay elements (shown as 302) starting from 1$^{st}$ delay element to 128$^{th}$ delay element. For a single traversal of the delay chain 224 (i.e., for generating a single cycle of the osc_clk 232), the 128 delay elements (see, 302) undergoes 256 state changes. FIG. 3 depicts 256 states (see, 304) of the 128 delay elements (see, 302). The first counter 208 and the second counter 210 are triggered to change count states based on a change in a state of the 64$^{th}$ delay element. The first counter 208 is triggered upon the state of the 64$^{th}$ delay element changing from 0 to 1 (see, 306). The second counter 210 is triggered upon the state of the 64$^{th}$ delay element changing from 1 to 0 (see, 308). The selection block 214 selects a count state of one of the first counter 208 or the second counter 210 based on a change of state of 128$^{th}$ delay element.

The selection block 214 selects the count state associated with the first counter 208, upon the state of the 128$^{th}$ delay element changing from 0 to 1 (see, 310) and selects the count state associated with the second counter 210 upon the state of the 128$^{th}$ delay element changing from 1 to 0 (see, 312). The selection block 214 ensures a fixed time gap between actuation and selection of each of the first counter 208 and the second counter 210. In an example, such time gap can be 1/4$^{th}$ of the clock period of the clock signal 206 between the change in state of the 64$^{th}$ delay element from 0 to 1 (see, 306) and change in state of the 128$^{th}$ delay element from 0 to 1 (see, 310) and between the change in state of the 64$^{th}$ delay element from 1 to 0 (see, 308) and change in state of the 128$^{th}$ delay element from 1 to 0 (see, 310). Such time gap allows stabilization of each of the first counter 208 and the second counter 210 subsequent to actuation and thereby enables obtaining a stabilized count state for generating the delay code 205.

In an embodiment, initially the first counter 208 holds a state value of 0 and the second counter 210 also holds a count state of 0. During the change in state (see, 306) from 0 to 1 of the 64$^{th}$ delay element, the first counter 208 is triggered and its count state is updated. The count state of the first counter 208 gets incremented to 1. Upon change in state (see, 310) from 0 to 1 of the 128$^{th}$ delay element, the selection block 214 selects the count state (e.g., 0) associated with the first counter 208 to generate the first portion 207 of the delay code. Upon the change in state (see, 308) of the 64$^{th}$ delay element, the second counter 210 is triggered and the count state of the second counter 210 is updated. The count state associated with the second counter 210 gets incremented from 0 to 1. Subsequently, upon the change in state (see, 312) of the $128^{th}$ delay element, the selection block 214 selects the count state (that is '1') of the first counter 210 to generate the first portion 207 of the delay code.

The change in the state (see, 312) from 1 to 0 of the $128^{th}$ delay element indicates generation of one clock cycle of the osc_clk 232 at the output of the delay chain 224. At this instant, the count state selected by the selection block 214 is also '1' indicating one complete clock cycle of the osc_clk 232. The count state selected by the selection block 214 is stored in the first buffer 222. Accordingly, the first buffer 222 stores a count state corresponding to N number of complete clock cycles of the osc_clk 232 (during a single clock cycle of the clock signal 206, or high level of the divided clock signal). On completion of N number of complete clock cycles of the osc_clk 232, a number of delay elements (for example, M) may be traversed in a partial clock cycle (if any) of the osc_clk 232, in addition to the N complete clock cycles. For instance, the clock period of the clock signal 206 is equivalent to 2*N times of the total delays generated by the delay elements 225 of the delay chain 224 and delays generated by M delay elements 225 of the delay chain 224. The count state associated with M delay elements is stored in the second buffer 230. It should be noted that N corresponds to the first portion and M corresponds to the second portion of the delay code corresponding to the clock signal 206. The delay code modification circuit 238 further generates the modified code 205 based on the delay code and the delay factor.

In an example, a clock period of the clock signal 206 is assumed to be 650 pico seconds (ps). The clock signal 206 is divided by 2 to generate the divided clock signal (or the code update signal 242) having a clock period of 1300 ps and the code update signal 242 is fed as a select line to the selection circuit 228. As the delay chain 224 includes 128 delay elements, and if each delay element generates a delay of 1 ps, one traversal of the delay chain 224 generates a delay of 128 ps. In this example, for generating a single clock cycle of the osc_clk 232, two traversals of the delay chain 224 will generates a delay of 256 ps. As the osc_clk 232 is generated during the high level of the divided clock signal (or the code update signal 242), so in a time period of 650 ps, two complete clock cycles of the osc_clk 232 and a partial clock cycle corresponding to the remaining 138 ps (corresponding to delay substantially equivalent to 138 delay elements of 1 ps delay each). The second buffer 230 stores a bit pattern corresponding to the 138 delay elements. In an example embodiment, logic states of the outputs of the delay elements 225 is stored in the second buffer 230 and based on the logic states, the second portion 209 is determined. For example, if outputs of each of the delay elements 225 of the delay chain 224 are zero, the logic state of registers of the second buffer 230 is $0_1 1_2 1_3 \ldots 1_{138}$, and accordingly, the second portion 209 is considered as 0. If the outputs of each of the delay elements 225 of the delay chain 224 are one, the logic state of registers of the second buffer 230 is $1_1 1_2 1_3 \ldots 1_{138}$, accordingly, the second portion 209 is considered as 1. Further, if a logic state of registers of the second buffer 230 is $0_1 1_2 1_3 \ldots 1_{138}$, the second portion 209 is considered as 129. In this example bit pattern, if the first 10 registers of the second buffer 230 have 0's and rest 118 registers have 1's the second portion 209 represents 138 delay elements.

As explained earlier, the selection block 214 updates the count state to a binary equivalent of two corresponding to the two complete clock cycles of the osc_clk 232 through the delay chain 224 by retrieving the count state from one of the more reliable counter (among the first counter 208 or the second counter 210). In an example, the count state is retrieved from one of the first counter 208 or the second counter 210 that is stable during changes in states 310 or 312, respectively, of the $128^{th}$ delay element. Upon completion of the two complete clock cycles of the osc_clk 232 through the delay chain 224, the first buffer 222 holds a count state of 2 (for example, a binary equivalent of 2). The second buffer 230 stores states of each of the plurality of delay elements 302 during a subsequent partial clock cycle corresponding to the remaining 138 ps.

The delay code modification circuit 238 retrieves the first portion 207 of the delay code and the second portion 209 of the delay code from the first buffer 222 and the second buffer 230, respectively, based on the corresponding count states. The clock period of the clock signal 206 is given by a sum of 2N* delay generated by the delay chain 224 and M* delay generated by a single delay element 225, where N is a count state stored in the first buffer 222 and M is the number of delay elements represented by the second buffer 230.

In an embodiment, the delay code modification circuit 238 determines binary values equivalent to N and M, and generates delay code corresponding to the clock signal 206. In another embodiment, the delay code modification circuit 238 scales the delay code (combination of the first portion 207 and the second portion 209) based on the delay factor 240, so that the scaled delay code 205 corresponds to a predetermined delay (for example, a compensated delay). The predetermined delay is a ratio of the clock period of the clock signal 206 and the delay factor 240. In an example, if the predetermined delay is 1.2 nanoseconds (ns), the delay factor 240 is programmed or configured to obtain a delay code 205 corresponding to 1.2 ns. In this example, if the clock period of the clock signal 206 is 100 ns, the delay circuit 200 is configured for 100 ns and generates a delay code corresponding to 100 ns based on the configuration. The delay code generated is converted to the delay code 205 corresponding to 1.2 ns by dividing the delay code (combination of the first portion 207 and the second portion 209) by a ratio of the clock period and the predetermined delay (e.g., 100/1.2, which is approximately equivalent to 83.33). The delay factor 240, for example, substantially equal to 83.33, is selected to generate the delay code 205 corresponding to 1.2 ns. By suitably choosing the delay factor 240, a plurality of delay codes corresponding to a plurality of predetermined delays is generated through the delay circuit 200. The predetermined delay is chosen based on requirement of a delay compensation in the circuit module configured to receive the delay code 205. The delay code 205 is generated at every falling edge of the code update signal 242. Generation and updation of the delay code 205 with respect to the code update signal 242 is explained in FIG. 4.

Figure 4:
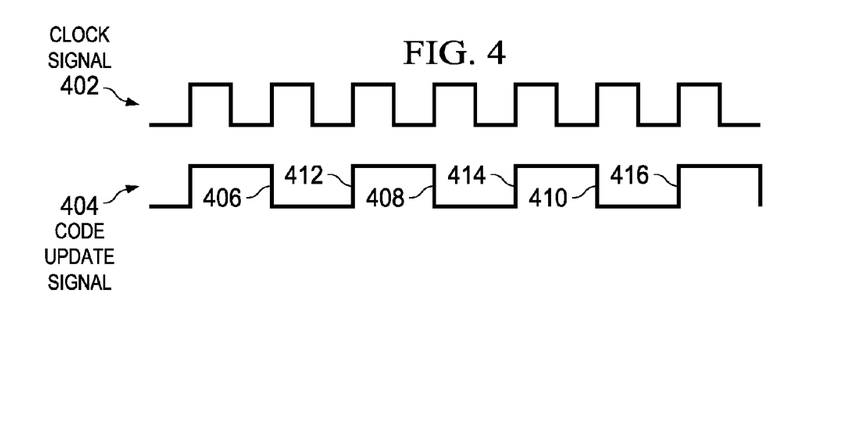
FIG. 4 illustrates example waveforms of a clock signal and a code update signal, according to an example embodiment.

FIG. 4 illustrates example waveforms of the clock signal 404 (an example of the clock signal 206) and the code update signal 404 (an example of the code update signal 242), according to an example embodiment. In so much, as the code update signal 404 is generated by dividing the clock signal 402 by 2, the clock period of the code update signal 404 is twice the clock period of the clock signal 402. In an embodiment, the code update signal 404 is transmitted along with the delay code generated through the delay circuit (e.g., the delay circuit 200) to a circuit module communicatively associated or coupled with the delay circuit for receiving the delay code.

In an example embodiment, the delay code is generated at every falling edge (e.g., falling edges 406, 408 and 410) of the code update signal 404. In an embodiment, the generated delay code is captured by the circuit module at a subsequent rising edge (e.g., rising edges 412, 414, and 416) of the code update signal 404. For example, the delay code generated at the falling edge 406 is captured at a subsequent rising edge 412, the delay code generated at the falling edge 408 is captured at a subsequent rising edge 414, and the delay code generated at the falling edge 410 is captured at a subsequent rising edge 416. The delay code generated at a first falling edge (e.g., 406) of the code update signal 404 is updated at every subsequent falling edge (e.g., 408 and 410) of the code update signal 404. In an embodiment, the delay circuit (e.g., the delay circuit 200 of FIG. 2) is calibrated or configured to generate a plurality of delay codes. The calibration is done by tracking the performance of the ring oscillator circuit (e.g., the ring oscillator circuit 202 of FIG. 2) of the delay circuit during each cycle of the clock signal 402.

The delay circuit 200 is configured to enable a delay compensation in a circuit module communicatively associated or coupled with the delay circuit 200. For instance, the circuit module such as the I/O device receives the delay code corresponding to the predetermine delay from the delay circuit 200, and generate the predetermined delay based on the delay code for achieving the delay compensation. An example of the delay compensation may include generating a predetermined delay for a slew rate compensation in the circuit module. It is noted that the terminology "slew rate" refers to, for example, a rate of change of output voltage corresponding to various signal paths of the circuit module or a rate of charging or discharging a load of the circuit module. The delay code is varied by changing the delay factor and/or the clock signal to various values so as to correspond to various predetermined delays. The delay circuit 200 may be coupled to a plurality of circuit modules, where each of the circuit modules may require a different delay code input based on an application. An example delay circuit configured to enable slew rate programmability of a plurality of circuit modules is described in FIG. 5.

Figure 5:
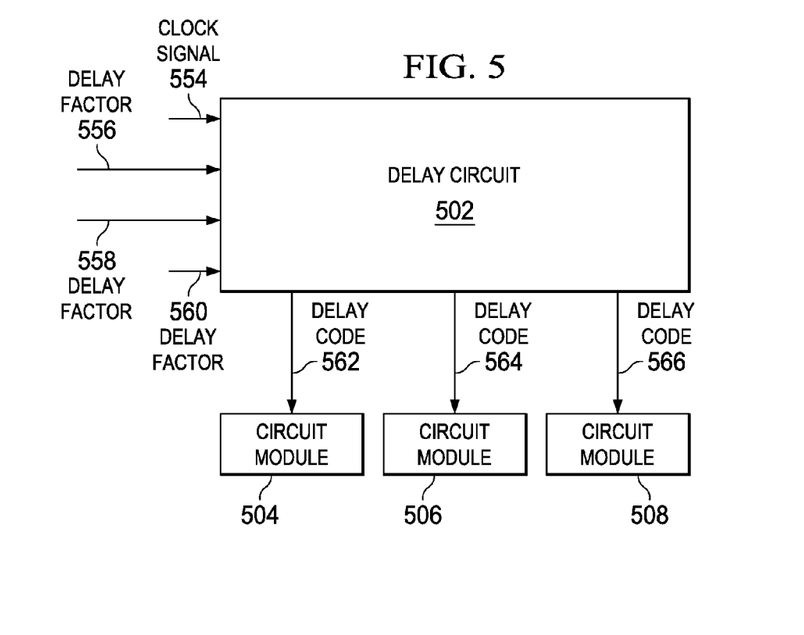
FIG. 5 is a block diagram representation of a circuit configured to provide delay codes to a plurality of circuit modules, according to an example embodiment.

FIG. 5 is a block diagram representation of a delay circuit configured to enable a delay compensation of a plurality of circuit modules, according to an example embodiment. As illustrated in FIG. 5, in an embodiment, a delay circuit 502 is communicatively associated, integrated or coupled with a plurality of circuit modules (e.g., 504, 506 and 508). In some embodiments, the delay circuit 502 is an example of the delay circuit 200. Examples of the plurality of circuit modules (e.g., 504, 506 and 508) include, but are not limited to, I/O drivers. The delay circuit 502 is configured to receive at least one of a clock signal 554 and a delay factor (e.g., 556, 558 and 560) and generate a delay code (e.g., 562, 564, and 566) based on at least one of the clock signal 554 and the delay factors 556, 558 and 560. By varying the clock signal 554 or a combination of the clock signal 554 and the delay factors 556, 558 and 560, various delay codes 562, 564 and 566 are generated. For example, the delay code 562 corresponds to the delay factor 556, the delay code 564 corresponds to the delay factor 558, and the delay code 566 corresponds to the delay factor 560. Similarly, the delay codes 556, 558 and 560 can also be generated by varying a clock period of the clock signal 554. The clock signal 554 and/or the delay factor (e.g., 556, 558 and 560) are adjusted to generate a delay code corresponding to a predetermined delay.

Examples of the delay factors 556, 558 and 560 include, but are not limited to, a division factor and a multiplying factor. In an embodiment, the delay code is a binary code. The delay code is, for example, one of an eight bit code, a sixteen bit code, and the like. The delay circuit 502 is configured to generate the delay codes 562, 564 and 566 for achieving the delay compensation. In an embodiment, the delay circuit 502 is calibrated or configured to generate the delay code. The calibration is performed by tracking the performance of the ring oscillator circuit (e.g., the ring oscillator circuit 202 of FIG. 2) of the delay circuit 502 during each cycle of the clock signal 554. The delay codes 562, 564 and 566 are generated based on the calibration or configuration, and are provided to the circuit modules (e.g., 504, 506 and 508) so as to generate corresponding delays therein in order to achieve the delay compensation in the signal paths of the circuit modules (e.g., 504, 506 and 508).

Figure 6:
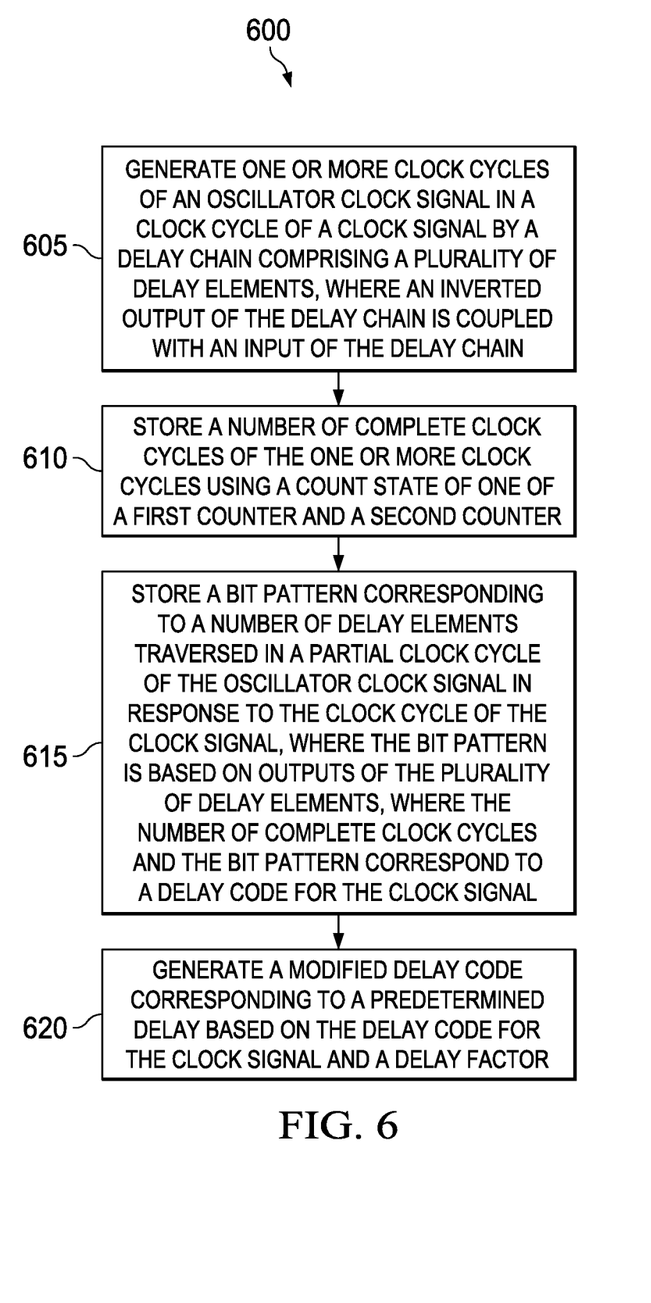
FIG. 6 depicts a flow chart of a method of generating a delay code, according to an example embodiment.

FIG. 6 depicts a flow chart of a method 600 of generating a delay code, according to an example embodiment. In an example, the method 600 may be performed in a delay circuit such as the delay circuit 200 as described in reference to FIG. 2. In operation 605, one or more cycle of an oscillator clock signal is generated in a clock cycle of a clock signal by delay chain including a plurality of delay elements, where an inverted output of the delay chain is coupled to an input of the delay chain. An example of the delay chain may be the delay chain 224 of the ring oscillator circuit 202. In an example, the delay chain includes the plurality of delay elements and an inverter connected in a closed loop configuration. In a single clock cycle of the clock signal, one or more complete cycles and a partial cycle of the oscillator clock signal are generated. In an embodiment, the clock signal is divided by two to generate a divided clock signal, and the oscillator clock signal is generated in high or low level of the divided clock signal. In an embodiment, in operation 610, a count state corresponding to a number of complete clock cycles in the one or more clock cycles of the oscillator clock signal is stored. In an example, the count state corresponding to the number of clock cycles is determined by the counter circuit 204 of FIG. 2.

In an embodiment, in operation 615, the method 600 includes storing a number of delay elements that are traversed in a partial clock cycle of the oscillator clock signal. The count state corresponding to the number of complete clock cycles of the oscillator clock signal and number of delay elements in the partial clock cycle constitute a delay code corresponding to the clock signal. For instance, a delay generated by the delay elements represented by the delay code is equivalent to the duration of the clock signal. The delay code corresponding to the clock signal is further utilized to generate a scaled/modified delay code that is provided to a circuit module (for example, I/O device), and the circuit module generates a predetermined delay corresponding to a delay compensation such as for the slew rate compensation against the PTV variations.

At operation 620, a delay code corresponding to the predetermined delay is generated based on the count state corresponding to the number of traversals, the number of delay elements and a delay factor. The delay code corresponds to a number of delay elements, and a sum of delays generated by the number of delay elements is substantially equal to the predetermined delay. In an embodiment, the delay code is generated during every single cycle of the clock signal. The delay factor includes a divide factor and/or a multiplication factor, and is based on the time period of the clock signal and the predetermined delay.

Without in any way limiting the scope, interpretation, or application of the claims appearing below, advantages of one or more of the example embodiments disclosed herein include a frequency range configurability based on a width of the counter. The present technology is suitable for applications which use system clock as a reference clock in so much as the frequency of system clock is typically very low. Also, the present technology does independent calibration on every pulse of the clock signal hence the delay code available on every edge of clock signal is proportional to an instantaneous process, temperature and/or voltage condition. The delay circuit disclosed herein calibrates and provides the delay code after a first cycle of the oscillator clock signal itself, hence there is no locking time requirement. Additionally, the delay chain is independent of frequency range supported and thus leads to drastic reduction in area.

Although the present technology has been described with reference to specific example embodiments, it is noted that various modifications and changes is made to these embodiments without departing from the broad spirit and scope of the present technology. For example, the various devices, modules, analyzers, generators, etc., described herein is enabled and operated using hardware circuitry (e.g., a complementary metal oxide semiconductor (CMOS) based logic circuitry), and/or any combination of hardware and software (e.g., embodied in a machine readable medium). For example, the various electrical structures may be embodied using transistors, logic gates, and electrical circuits (e.g., ASIC circuitry and/or in Digital Signal Processor (DSP) circuitry) and drawings are to be regarded in an illustrative rather than a restrictive sense.

Also, the circuits described and illustrated in the various embodiments as discrete or separate is combined or integrated with other systems, modules, without departing from the scope of the present technology. Other items shown or discussed as directly coupled or communicating with each other is coupled through some interface or device, such that the items may no longer be considered directly coupled to each other but may still be indirectly coupled and in communication, whether electrically, mechanically, or otherwise, with one another. Other examples of changes, substitutions, and alterations ascertainable by one skilled in the art, upon studying the example embodiments disclosed herein, may be made without departing from the spirit and scope of the present technology.

We claim:

1. A delay circuit, comprising:
    a ring oscillator circuit comprising a delay chain comprising a plurality of delay elements, an inverted output of the delay chain coupled with an input of the delay chain, the ring oscillator circuit configured to generate one or more cycles of an oscillator clock signal in response to a clock cycle of a clock signal;
    a counter circuit communicatively coupled with the ring oscillator circuit, the counter circuit comprising
        a first counter configured to be triggered at a rising edge of the oscillator clock signal at an output of a delay element of the plurality of delay elements;
        a second counter configured to be triggered at a falling edge of the oscillator clock signal at the output of the delay element;
        a first buffer configured to store a number of clock cycles of the oscillator clock signal in response to the clock cycle of the clock signal based on count states of the first counter and the second counter; and
        a second buffer configured to store a bit pattern corresponding to a number of delay elements traversed in a partial clock cycle of the oscillator clock signal in response to the clock cycle of the clock signal, wherein the bit pattern is based on outputs of the plurality of delay elements,
    wherein the number of clock cycles stored in the first buffer and the bit pattern corresponding to the number of delay elements in the partial clock cycle correspond to a delay code for the clock signal, and wherein the delay code corresponds to a number of delay elements and wherein a sum of delays generated by the number of delay elements is substantially equal to a clock period of the clock signal.

2. The delay circuit of claim 1, wherein the counter circuit further comprises:
    a register block coupled to the first counter and the second counter, the register block comprising
        a third buffer coupled to the first counter to store a count state of the first counter, and
        a fourth buffer coupled to the second counter to store a count state of the second counter; and
    a selection block coupled to the register block and configured to select a count state from among the count state of the first counter and the count state of the second counter as the number of clock cycles of the oscillator clock signal.

3. The delay circuit of claim 2, wherein the first buffer is coupled to the selection block and is configured to receive the selected count state from among the count state of the first counter and the count state of the second counter from the selection block and is configured to store the selected count state as the number of clock cycles of the oscillator clock signal.

4. The delay circuit of claim 2, wherein the selection block is configured to select the count state from among the count state of the first counter and the count state of the second counter based on an output of the delay chain.

5. The delay circuit of claim 1, further comprising a clock divider circuit for dividing the clock signal by two to generate a divided clock signal.

6. The delay circuit of claim 5, further comprising:
    a selection circuit configured to provide the inverted output of the delay chain to the input of the delay chain during a high level of the divided clock signal and configured to provide a fixed logic signal to the input of the delay chain during a low level of the divided clock signal.

7. The delay circuit of claim 6, wherein the ring oscillator circuit comprises an inverter coupling the output of the delay chain to the selection circuit.

8. The delay circuit of claim 6, wherein the second buffer is coupled with the outputs of the plurality of delay elements of the delay chain and is configured to store the bit pattern corresponding to the number of delay elements traversed in the partial clock cycle of the oscillator clock signal.

9. The delay circuit of claim 8, wherein the second buffer includes a set of registers clocked by the divided clock signal.

10. The delay circuit of claim 1, further comprising:
    a delay code modification circuit to generate a modified delay code corresponding to a predetermined delay based on the delay code for the clock signal and a delay factor, wherein the modified delay code corresponds to a number of delay elements, and wherein a sum of delays generated by the number of delay elements is substantially equal to the predetermined delay.

11. The delay circuit of claim 10, wherein the delay factor is based on the clock period of the clock signal and the predetermined delay, and wherein the predetermined delay corresponds to a delay associated with compensation for at least one of a process variation, a temperature variation, and a voltage variation in a circuit module.

12. The delay circuit of claim 11, wherein the delay factor is at least one of a divide factor and a multiplication factor.

13. The delay circuit of claim 10, further comprising a fifth buffer to store the modified delay code.

14. The delay circuit of claim 1, wherein the delay element is an intermediate delay element from among the plurality of delay element in the delay chain.

15. A method, comprising:
   generating one or more clock cycles of an oscillator clock signal in a clock cycle of a clock signal, by a delay chain comprising a plurality of delay elements, wherein an inverted output of the delay chain is coupled with an input of the delay chain;
   storing a number of complete clock cycles of the one or more clock cycles using a count state of one of a first counter and a second counter, wherein the first counter is configured to be triggered at a rising edge of the oscillator clock signal at an output of a delay element of the plurality of delay elements, and wherein the second counter is configured to be triggered at a falling edge of the oscillator clock signal at the output of the delay element; and
   storing a bit pattern corresponding to a number of delay elements traversed in a partial clock cycle of the oscillator clock signal in response to the clock cycle of the clock signal, wherein the bit pattern is based on outputs of the plurality of delay elements,
   wherein the number of complete clock cycles and the bit pattern corresponding to the number of delay elements in the partial clock cycle correspond to a delay code for the clock signal, and wherein the delay code corresponds to a number of delay elements and wherein a sum of delays generated by the number of delay elements is substantially equal to a clock period of the clock signal.

16. The method of claim 15, wherein storing the number of complete clock cycles comprises:
   triggering the first counter at a rising edge of the oscillator clock signal at the delay element of the plurality of delay elements;
   triggering the second counter at a falling edge of the oscillator clock signal at the delay element; and
   selecting a count state from among a count state of the first counter and a count state of the second counter based on an output of the delay chain, wherein the selected count state correspond to the number of complete clock cycles.

17. The method of claim 15, wherein storing the bit pattern comprises storing the outputs of the plurality of delay elements of the delay chain.

18. The method of claim 15, further comprising generating a modified delay code corresponding to a predetermined delay based on the delay code for the clock signal and a delay factor, wherein the modified delay code corresponds to a number of delay elements, and wherein a sum of delays generated by the number of delay elements is substantially equal to the predetermined delay.

19. The method of claim 18, wherein the delay factor is at least one of a divide factor and a multiplication factor.

20. The method of claim 18, wherein the delay factor is based on the clock period of the clock signal and the predetermined delay, and wherein the predetermined delay corresponds to a delay for slew rate compensation for at least one of a process variation, a temperature variation, and a voltage variation in a circuit module.

* * * * *